United States Patent [19]

Shirasu

[11] Patent Number: 5,250,868
[45] Date of Patent: Oct. 5, 1993

[54] PIEZOELECTRIC EFFECT DEVICE

[75] Inventor: Tetsuo Shirasu, Tokyo, Japan

[73] Assignee: NEC Corporation, Japan

[21] Appl. No.: 720,255

[22] Filed: Jun. 24, 1991

[30] Foreign Application Priority Data

Jun. 27, 1990 [JP] Japan .................... 2-169139

[51] Int. Cl.$^5$ ............................ H01L 41/08
[52] U.S. Cl. ........................ 310/328; 310/346
[58] Field of Search .............. 310/328, 346, 366

[56] References Cited

U.S. PATENT DOCUMENTS

| | | | |
|---|---|---|---|
| 4,219,755 | 8/1980 | O'Neill et al. | 310/348 |
| 4,267,478 | 5/1981 | Ljung et al. | 310/315 |
| 4,374,472 | 2/1983 | Nishimura | 73/35 P |
| 4,523,121 | 6/1985 | Takahashi et al. | 310/334 |
| 4,808,874 | 2/1989 | Stalhuth | 310/328 |
| 4,845,399 | 7/1989 | Yasuda et al. | 310/328 |
| 5,038,069 | 8/1991 | Lokasiewicz et al. | 310/346 |
| 5,059,850 | 10/1991 | Yoshimura et al. | 310/328 |

FOREIGN PATENT DOCUMENTS

| | | | |
|---|---|---|---|
| 3422935 | 12/1984 | Fed. Rep. of Germany | 310/358 |
| 0159777 | 7/1986 | Japan | 310/364 |

Primary Examiner—Mark O. Budd
Assistant Examiner—Thomas M. Dougherty
Attorney, Agent, or Firm—Laff, Whitesel, Conte & Saret

[57] ABSTRACT

A piezoelectric effect device has a piezoelectric body comprised of a sintered multilayer pillar composed of alternately laminated piezoelectric ceramic sheets and internal electrodes such that edges of the internal electrodes are alternately insulated every one another layers along opposite side faces of the sintered multilayer pillar, and a pair of external electrodes provided on the opposite side faces to electrically connect to noninsulated edges of the internal electrodes. There is provided a metal stem having a pair of hermetically sealed external terminals electrically coupled to the pair of external electrodes. A metal case having flexibility in a displacement direction of the piezoelectric body is seal-welded to the metal stem at their contacts to hermetically enclose the piezoelectric body. A pair of metal pads having a linear thermal expansion coefficient less than ten times as that of the piezoelectric body are provided to substantially cover opposite end faces of the piezoelectric body. One metal pad is centrally spot-welded to an inner face of the metal stem in opposed relation to one end face of the piezoelectric body and is secured thereto by an adhesive, and the other metal pad is centrally spot-welded to an inner face of the metal case in opposed relation to the other end face of the piezoelectric body and is secured thereto by an adhesive.

5 Claims, 8 Drawing Sheets

PIEZOELECTRIC EFFECT DEVICE

BACKGROUND OF THE INVENTION

The present invention relates to a piezoelectric effect device utilizing longitudinal piezoelectric effect, and more specifically relates to a housing structure of the device.

Figure 1:
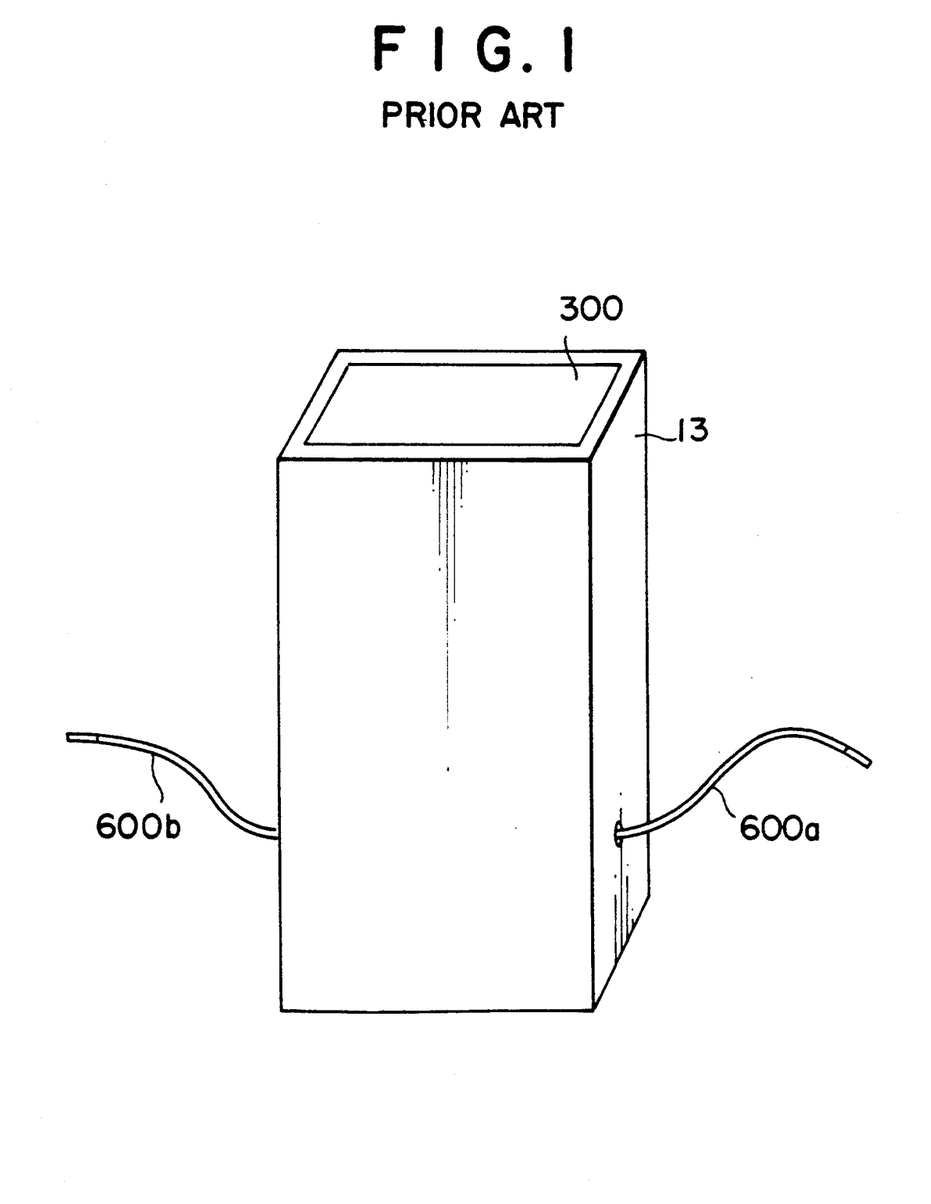
FIG. 1 is an overall perspective view of one conventional piezoelectric effect device having a resin overcoating.

Conventionally, as shown in FIG. 1, such type of the piezoelectric effect device is comprised of a piezoelectric body 300 having a multilayer structure of a sheet or plate made of piezoelectric ceramic material and an internal electrode made of silver-palladium alloy, laminated alternately with one another. A pair of external electrodes are coated to electrically connect to the internal electrodes every one another. A pair of lead wires 600a and 600b are electrically connected to the respective external electrodes. An organic polymer film 13 composed of epoxy resin etc. is overcoated around a peripheral surface of the piezoelectric body 300 except top and bottom faces of the body.

Figure 2:
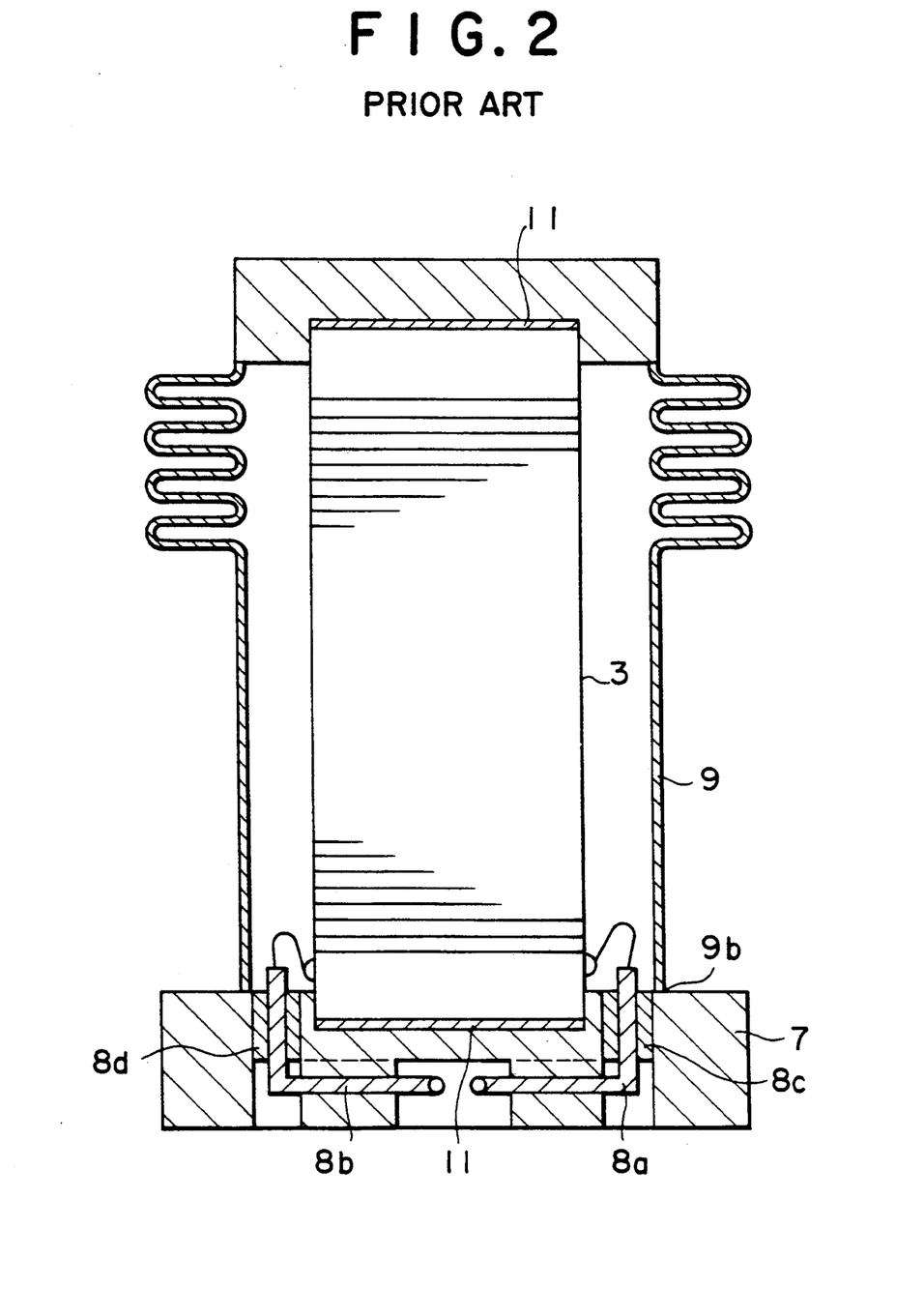
FIG. 2 is a vertical sectional view of another conventional piezoelectric effect device having a metal housing.

In another prior art as shown in FIG. 2, a piezoelectric body 3 is enclosed by a metal case 9 and a metal stem 7, which are welded together at contact edges 9b to seal the body 3 to thereby improve durability or reliability. The metal stem 7 is provided with a pair of external terminals 8a and 8b supported through hermetic sealers 8c and 8d, and is fixed to one end of the piezoelectric body 3 by means of an adhesive 11. The metal case 9 is also fixed to the other end of the piezoelectric body 3 through another adhesive 11.

With regard to the first-mentioned conventional piezoelectric effect device, an exterior protection is composed of an organic polymer coating which has physical weakness with respect to humidity-resistance due to its permeability and absorptive naturer chemical- or solvent-resistance, and oil-resistance, and which contains contaminant ions, thereby causing spark defect due to reduction of surface resistivity between the internal electrodes, or short defect due to migration of silver component in the internal electrodes.

With regard to the second-mentioned prior art, the metal stem 7 and metal case 9 are generally composed of stainless steel material in view of its good corrosion resistance. However, when curing the adhesive 11 by heating, the piezoelectric body may generate chipping or cracking defect due to thermal stress caused by difference of linear thermal expansion coefficient between the stainless steel material (ten and several ppm/°C.) and the piezoelectric body (about 1 ppm/°C.). Such defect may also occur when driving the device at or below the room temperature.

On the other hand, when using another metal material of a relatively low thermal expansion rate such as Invar alloy (several ppm/°C.) and Super-Invar alloy (about 1 ppm/°C.) instead of stainless steel, there would be caused various drawbacks such as these materials are difficult to process or treat to thereby increase production costs, hermetic seal glass is not formed stably to thereby cause cracking or leaking, and these materials have less corrosion-resistance to thereby degrade reliability of the products.

SUMMARY OF THE INVENTION

An object of the present invention is to provide a highly reliable piezoelectric effect device which can avoid destruction due to thermal expansion rate difference between the metal case and stem and the piezoelectric body, which does not cause reduction of productivity and increase of production cost, and which can block penetration of water, chemicals; oil and other vapors.

The inventive piezoelectric effect device comprises a piezoelectric body of a sintered multilayer pillar composed of alternately laminated piezoelectric ceramic sheets and internal electrodes such that edges of the internal electrodes are alternately insulated every one another layers along opposite sides of the sintered multilayer pillar. A pair of external electrodes are provided on the opposite sides of pillar to electrically connect to noninsulated edges of the internal electrodes. There is provided a metal stem having a pair of hermetically sealed external terminals electrically coupled to the pair of external electrodes. A metal case having flexibility in a displacement direction of the piezoelectric body is seal-welded to the metal stem at their contacts to hermetically enclose the piezoelectric body. A pair of metal pads having a linear thermal expansion coefficient less than ten times as that of the piezoelectric body are dimensioned to substantially cover opposite end faces of the piezoelectric body. The one metal pad is centrally spot-welded to an inner face of the metal stem in opposed relation to one end face of the piezoelectric body and is secured thereto by an adhesive, and the other metal pad is centrally spot-welded to an inner face of the metal case in opposed relation to the other end face of the piezoelectric body and is secured thereto by an adhesive.

DETAILED DESCRIPTION OF EMBODIMENTS

Figure 3:
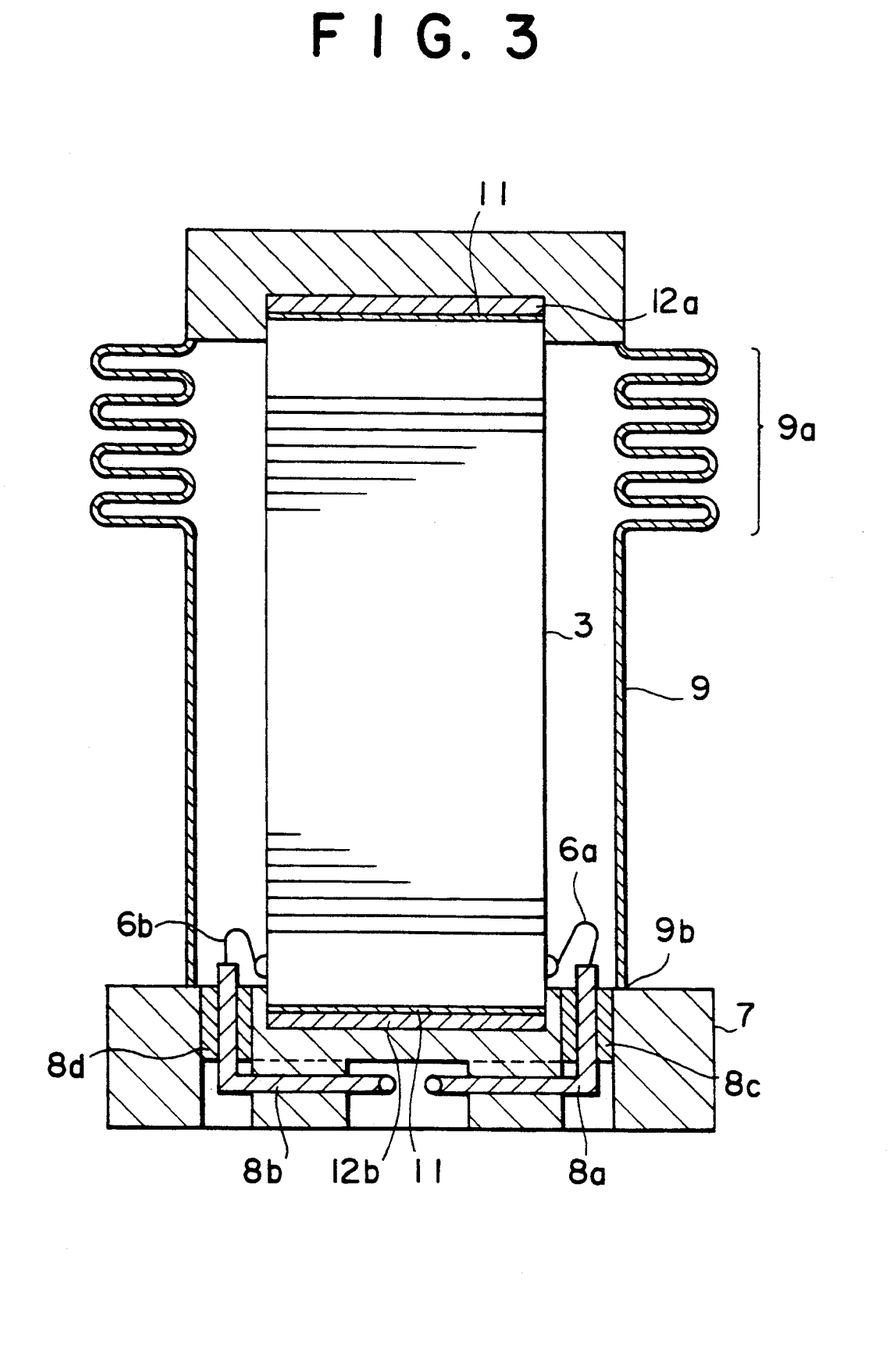
FIG. 3 is a vertically sectional view of a first embodiment of the inventive piezoelectric effect device.
Figure 4:
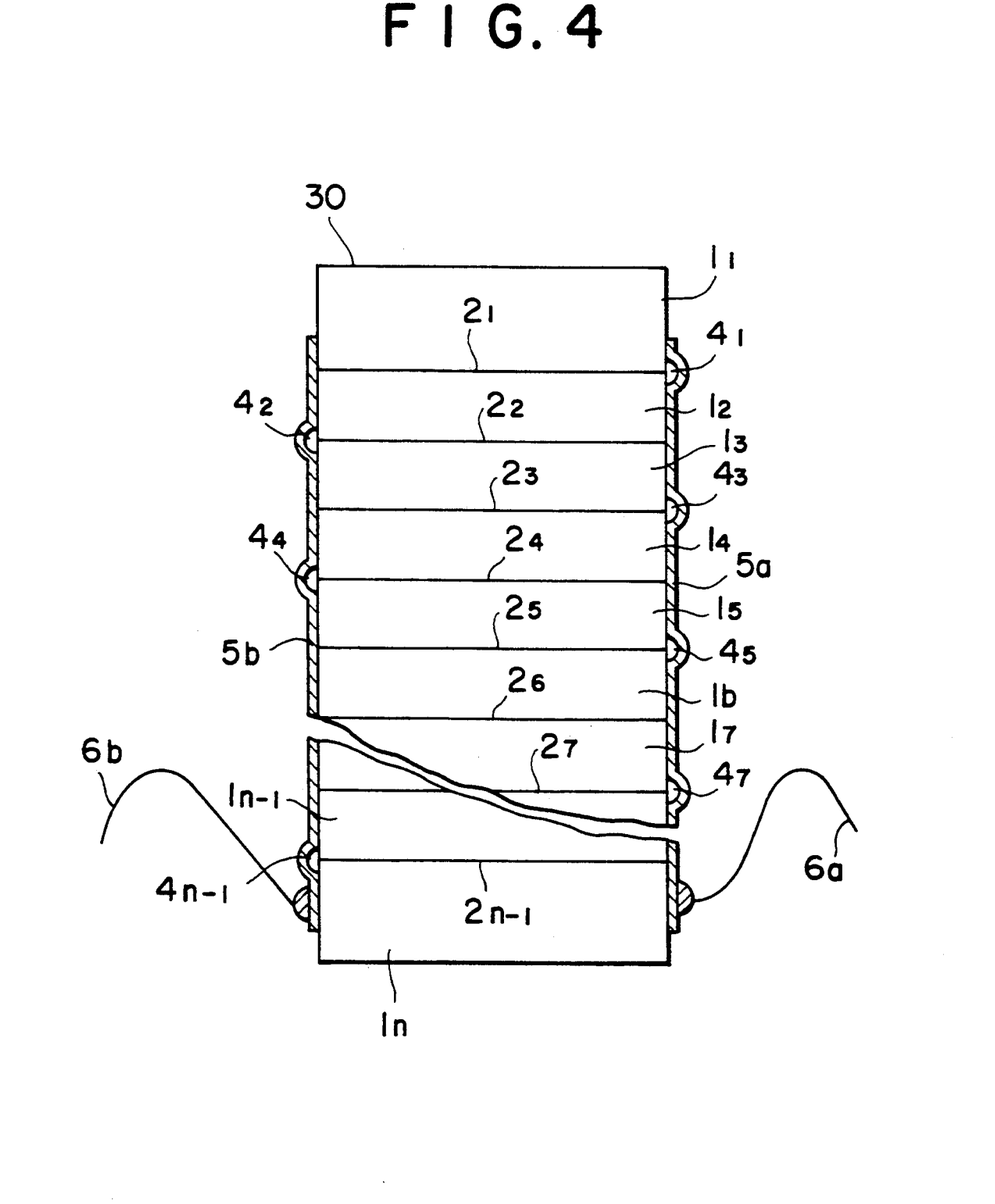
FIG. 4 is a vertically sectional view of a piezoelectric body in the first embodiment.
Figure 5:
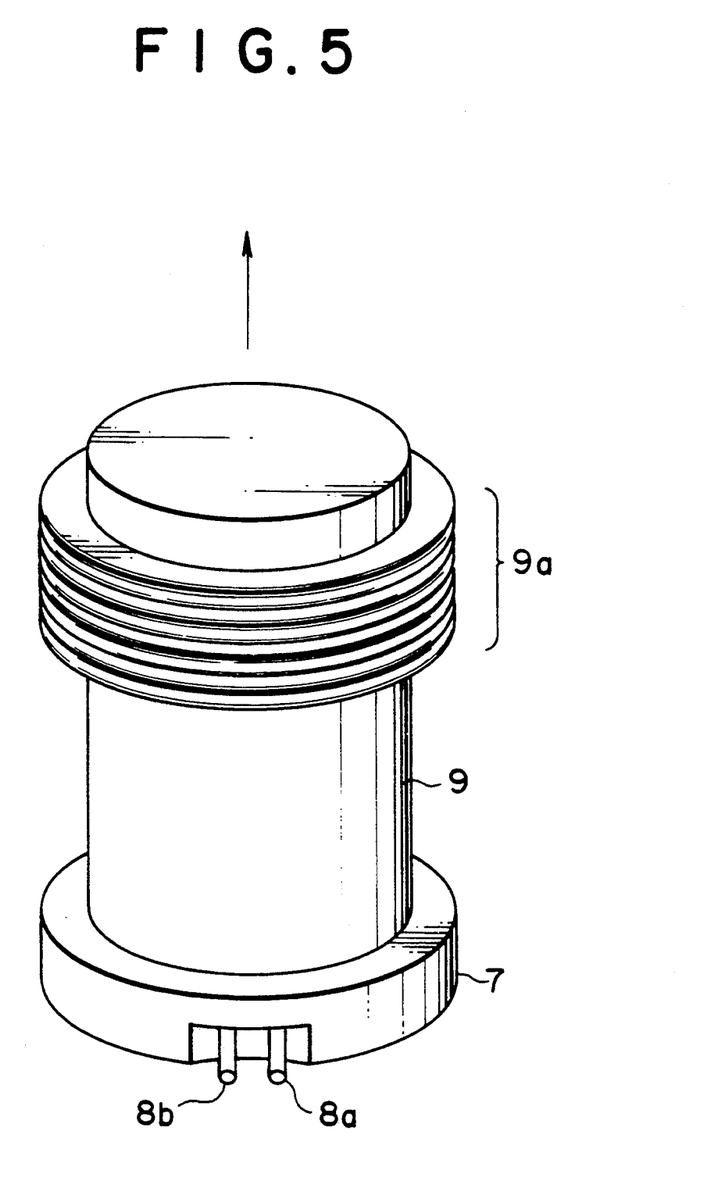
FIG. 5 is an overall perspective view of the first embodiment.

Next, the present invention will be described in detail with reference to the drawings. FIG. 3 shows a vertical sectional view of a first embodiment of the inventive piezoelectric effect device, FIG. 4 shows a vertical sectional view of a piezoelectric body to be enclosed by a metal case and a metal stem to constitute the first embodiment of the inventive piezoelectric effect device, and FIG. 5 shows a perspective overall view of the completed device of the first embodiment.

In this embodiment, the piezoelectric effect device is comprised of a piezoelectric body 3, a metal case 9, and a metal stem 7 of the lid-like shape welded to a contact edge 9b of the metal case 9 to hermetically enclose the piezoelectric body 3. The metal case 9 has a top end provided with a spot-welded metal pad 12a having a thermal expansion coefficient less than several times as that of the piezoelectric body 3. The case 9 is fixed to a top end of the piezoelectric body 3 through the metal pad 12a by means of an adhesive 11. The metal case 9 has bellows 9a expandable in a vertical polarization or displacement direction of the piezoelectric body 3. The metal stem 7 is provided thereon with a similar metal pad 12b which is fixed to a bottom end of the piezoelectric body 3 by means of an adhesive 11. The metal stem 7 has a pair of external terminals 8a and 8b which are sealed by hermetic sealers 8c and 8d and which are electrically connected to a pair of external electrodes of the piezoelectric body 3 through corresponding lead wires 6a and 6b.

Next, the description is given for the method of producing the first embodiment of the piezoelectric effect device. At first, there is prepared a paste composed of an organic solvent dispersed with a mixture comprised of a presintered powder of piezoelectric material containing mainly $Pb(Ni_{\frac{1}{3}}Nb_{\frac{2}{3}})O_3$, $PbTiO_3$ and $PbZrO_3$ etc. and an additive of organic binder. This paste is processed by, for example, slip-canting method to form a piezoelectric ceramic film 1 having a thickness of about 100 μm. Then, the piezoelectric ceramic film 1 is applied on its one face with an internal electrode 2. The internal electrode 2 is formed by coating an electroconductive paste comprised mainly of a mixed powder containing silver powder and palladium powder at the weight ratio of 7:3 by screen printing at a thickness of about 10 μm. The thus obtained ceramic films are laminated with one another and then sintered at about 1100° C. for 2 hours to form a laminated structure. This laminated structure is cut to form a sintered multilayer body 30 of a square pillar having a pair of opposite side faces such that edges of the cut internal electrodes $2_1-2_{n-1}$ are exposed along the opposite side faces. Then, insulating layers $4_1-4_{n-1}$ are formed to cover the exposed edges of the internal electrodes $2_1-2_{n-1}$ alternately along the opposite side faces by selective coating and curing of glass powder by means of electrophoretic method etc. Subsequently, the internal electrodes $2_1-2_{n-1}$ are alternately connected electrically with every each other by printing and curing an electrically conductive paste containing mainly a silver powder to form a pair of external electrodes 5a and 5b along the opposite side faces. Further, a pair of lead wires 6a and 6b are provided to make electrical contact with the respective ones of the external electrodes 5a and 5b to form the piezoelectric body 3.

In next step, a metal material such as stainless steel is cold-pressed to form a metal cylinder, and then the metal cylinder is processed by fluid extrusion method to form flexible bellows 7a around a periphery of the cylinder to produce the metal case 9. Further, there is provided a disc-like metal stem 7 composed of the same material as that of the metal case 9 and having a pair of external terminals 8a and 8b composed of iron alloy, copper alloy or nickel and hermetically sealed to the stem 7. The piezoelectric body 3 is enclosed by the metal case 9 and the metal stem 7. In such constructions a metal pad 12a of the disc shape is provisionally fixed centrally to a top inner face of the metal case's by spot-welding. The metal pad 12a is composed of Super-Invar steel, Invar steel or 42-Ni steel etc. having a relatively low linear thermal expansion coefficient in the order of less than 5 ppm/°C. whereas the piezoelectric body 3 has about 1 ppm/°C. of linear thermal expansion coefficient in this embodiment. The metal case 9 is fixed to the top end of the piezoelectric body 3 through the disc-like metal pad 12a by means of an adhesive 11 such as epoxy resin. The metal pad 12a has a given area dimension sufficient to cover the top end of the piezoelectric body 3. In similar manners another metal pad 12b is provisionally fixed centrally to the metal stem 7 by spot-welding. In order to achieve the damper effect intended by the present invention, it is necessary that the thickness of the metal pad is 0.5 mm or thereabove. The linear expansion coefficient of the metal pad may be selected within a range from 1 to 10 ppm/°C. However, selection within a range from 1 to 7 ppm/°C. is preferable, and selection within a range from 1 to 3 ppm/°C. is most preferable. The larger the cross-sectional dimensions of the piezoelectric effect device are, the smaller the linear expansion coefficient of the metal pad should be selected. The metal stem 7 is fixed to the bottom end of the piezoelectric body 3 through the metal pad 12b by means of an adhesive 11. At this step, the lead wires 6a and 6b are electrically connected to the corresponding external terminals 8a and 8b by means of soldering or welding. Lastly, the assembled construction is heated or baked in vacuum, and thereafter the metal stem 7 is sealed to contact edges 9b of the metal case 9 by means of laser beam welding method, electron beam welding method, resistive welding method or Tig welding method to thereby complete a piezoelectric effect device whose overall perspective view is shown in FIG. 5.

Figure 6:
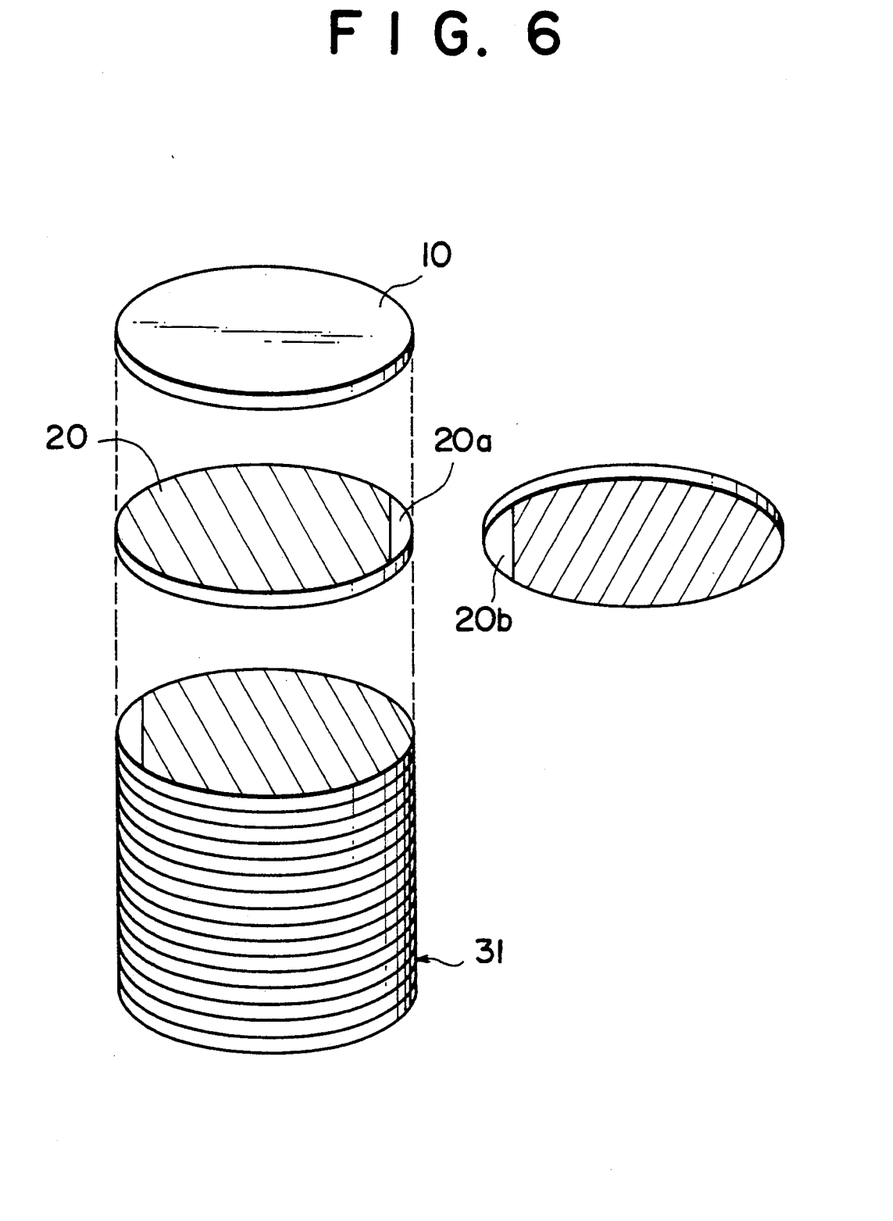
FIG. 6 is a schematic perspective view showing a structure of a piezoelectric body provided in a second embodiment of the inventive piezoelectric effect device.
Figure 7:
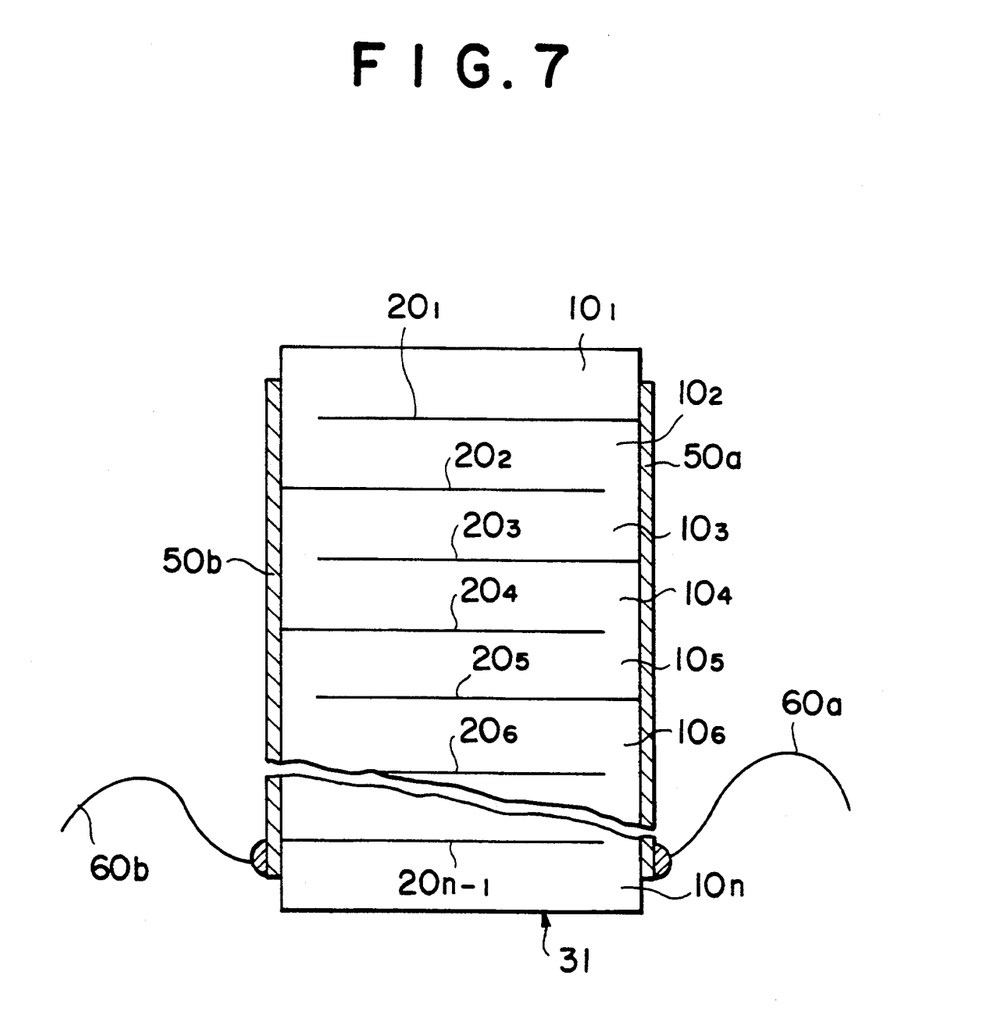
FIG. 7 is a vertical section of the piezoelectric body of FIG. 6.

FIG. 6 shows a structural perspective view of a piezoelectric effect device prior to housing work, according to a second embodiment of the invention and FIG. 7 is a vertically sectional view of the same piezoelectric effect device. The second embodiment of the piezoelectric effect device is constructed of a so-called stack type. In making, there is provided a sintered piezoelectric ceramic disc 10. The disc 10 is provided on its opposite faces with internal electrodes 20 having a marginal top space 20a and a marginal bottom space 20b, which are diametrically staggered from each other. Then, as shown in FIG. 7, a plurality of piezoelectric ceramic discs $10_1-10_n$ are laminated with one another by means of an adhesive to form a multilayer structure 31 of a cylindrical shape such that the marginal top and bottom spaces 20a and 20b are registered with one another along an interface to avoid exposure of an internal electrode 20, alternately along the diametrically opposite sides of the cylinder. Further, a pair of external electrodes 50a and 50b are formed along the diametrically opposite sides of the cylinder to alternately electrically connect to the exposed edges of the internal electrodes $20_1-20_{n-1}$ every each other. Further, a pair of lead wires 60a and 60b are provided to make electrical contact to the external electrodes 50a and 50b to thereby form a piezoelectric body of the stack type. This piezoelectric body is completely sealed by a metal case and a metal stem, which have fixed metal pads of relatively small linear thermal expansion coefficient, in manner similar to the first embodiment.

In operation of the piezoelectric effect device as shown in FIGS. 3-7, a drive voltage is applied from a voltage supply (not shown in the drawings) to the pair of external terminals 8a and 8b. This drive voltage is imposed on the opposite faces of each of the piezoelectric ceramic layers $1_2-1_{n-1}$ through the lead wires 6a and 6b, the external electrodes 5a and 5b, and the internal electrodes $2_1-2_{n-1}$ so that the device induces stress and strain in a direction indicated by the arrow of FIG. 5 while the metal stem 7 is fixed to a base.

Figure 8:
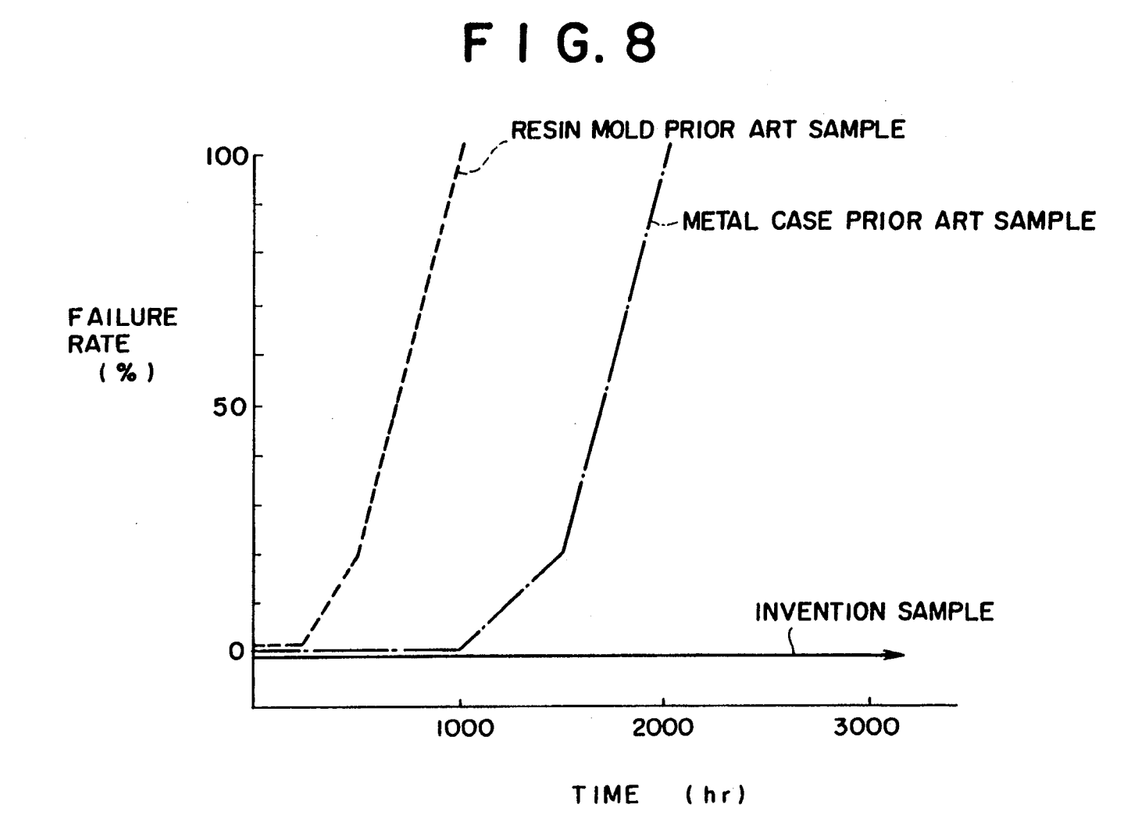
FIG. 8 is a graph showing results of cyclic humidity-resistance test.

FIG. 8 shows test results of humidity-resistance of the inventive device. The characteristic feature of the inventive device as shown in FIG. 8 represents the case where a Super-Invar steel having the thickness of 0.5 mm is used as a metal pad. The test was carried out by placing samples in high humidity while applying pulse voltage of 150 V at 15 Hz. The conventional device samples of the resin-mold type were all destructed at 1000 hours due to spark defect or short defect. With regard to the other conventional device samples of the metal housing type utilizing stainless steel material, no such defect was observed, but they were destructed at 2000 hours ($10^8$ cycles) due to chipping or cracking caused by repeated stress. On the other hand, the inventive device samples did not generate such defects even over 3000 hours of test period ($1.5 \times 10^8$ cycles), thereby proving significant effect of the invention.

As described above, according to the invention, the piezoelectric body is completely enclosed by a metal case and a metal stem. The piezoelectric body is fixed between the metal case and the metal stem through metal pads having a linear thermal expansion coefficient close to that of the piezoelectric device. By such construction, the device can be prevented from destruction which would be caused by difference of linear thermal expansion coefficient between the piezoelectric body and the metal case and stem. Further, the device housing can completely block humidity, chemical substances, oil and other vapors to improve reliability of the device.

What is claimed is:

1. A piezoelectric effect device comprising: a piezoelectric body comprised of a sintered multilayer pillar composed of alternately laminated piezoelectric ceramic sheets and internal electrodes such that edges of the internal electrodes are alternately insulated along opposite side faces of the sintered multilayer pillar, and a pair of external electrodes provided on the opposite side faces to electrically connect to noninsulated edges of the internal electrodes; a metal stem having a pair of hermetically sealed external terminals electrically coupled to the pair of external electrodes; a metal case having flexibility in a displacement direction of the piezoelectric body and being seal-welded to the metal stem at their contacts to hermetically enclose the piezoelectric body; and a pair of metal pads being dimensioned to substantially cover opposite end faces of the piezoelectric body, one metal pad being centrally spot-welded to an inner face of the metal stem in opposed relation to one end face of the piezoelectric body and being secured thereto by an adhesive, the other metal pad being centrally spot-welded to an inner face of the metal case in opposed relation to the other end face of the piezoelectric body and being secured thereto by an adhesive, said metal stem and metal case having a coefficient of thermal expansion of between ten and several ppm/°C. and said metal pad having a coefficient of thermal expansion of less than 5 ppm/°C.

2. A piezoelectric effect device according to claim 1, wherein the thickness of the metal pad is 0.5 mm or thereabove.

3. A piezoelectric effect device according to claim 1, wherein each increase in cross-sectional dimensions of the piezoelectric effect device is associated with a reduction in the linear expansion coefficient of the metal pad.

4. A piezoelectric effect device according to claim 1, wherein the linear expansion coefficient of the metal pad is within a range from 1 to 10 ppm/°C.

5. A piezoelectric effect device according to claim 1, wherein the piezoelectric ceramic sheet is made of any of Pb(Ni$_\frac{1}{3}$Nb$_\frac{2}{3}$), PbTiO$_3$ and PbZrO$_3$.

* * * * *